United States Patent
Hardee

(12) 
(10) Patent No.: US 10,103,731 B2
(45) Date of Patent: *Oct. 16, 2018

(54) CALIBRATION CIRCUIT FOR ON-CHIP DRIVE AND ON-DIE TERMINATION

(71) Applicant: Integrated Silicon Solution, Inc., Milpitas, CA (US)

(72) Inventor: Kim C. Hardee, Colorado Springs, CO (US)

(73) Assignee: Integrated Silicon Solution, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/688,527

(22) Filed: Aug. 28, 2017

(65) Prior Publication Data

US 2018/0048310 A1 Feb. 15, 2018

Related U.S. Application Data

(63) Continuation of application No. 15/226,488, filed on Aug. 2, 2016, now Pat. No. 9,780,785.

(Continued)

(51) Int. Cl.
*H03K 19/00* (2006.01)
*H03K 5/24* (2006.01)
(Continued)

(52) U.S. Cl.
CPC ... *H03K 19/0005* (2013.01); *G11C 29/50008* (2013.01); *H03K 5/24* (2013.01);
(Continued)

(58) Field of Classification Search
CPC ....... H03K 19/0005; H03K 19/018557; H03K 19/018585; H03K 17/6871;
(Continued)

(56) References Cited

U.S. PATENT DOCUMENTS 6,525,558 B2  2/2003 Kim et al.
6,573,746 B2  6/2003 Kim et al.
(Continued)

FOREIGN PATENT DOCUMENTS

| CN | 101226764 A | 7/2008 |
|----|-------------|--------|
| CN | 101256826 A | 9/2008 |
| CN | 103095248 A | 5/2013 |

OTHER PUBLICATIONS

IS43/46TR16512A Data Sheet for 512Mx16 8Gb DDR3 SDRAM, Integrated Silicon Solution, Inc., Aug. 13, 2014, available at www.issi.com.

*Primary Examiner* — Vibol Tan
(74) *Attorney, Agent, or Firm* — Innovation Counsel LLP

(57) ABSTRACT

Calibration circuits and methods to set an on-chip impedance to match a target impedance where the reference voltage does not equal one-half of the positive power supply voltage Vddq are described. In particular, calibration circuits and methods are provided to enable accurate impedance matching at a reference voltage Vref of K*Vddq, where K is a number between 0 and 1. In some embodiments, a calibration circuit for impedance matching at a reference voltage of K*Vddq uses a ratioed current mirror. In another embodiment, a calibration circuit for impedance matching at a reference voltage of K*Vddq uses a ratioed mirror pull-up circuit. In yet another embodiment, a calibration circuit for impedance matching at a reference voltage of K*Vddq uses a ratioed target impedance.

18 Claims, 7 Drawing Sheets

Related U.S. Application Data

(60) Provisional application No. 62/270,344, filed on Dec. 21, 2015.

(51) Int. Cl.
 *H03K 19/0175* (2006.01)
 *G11C 29/50* (2006.01)
 *H03K 19/0185* (2006.01)

(52) U.S. Cl.
 CPC ........... *H03K 19/017545* (2013.01); *H03K 19/017581* (2013.01); *H03K 19/018557* (2013.01); *H03K 19/018585* (2013.01); *H03K 2217/94031* (2013.01)

(58) Field of Classification Search
 CPC ......... H03K 17/6872; H03K 19/00315; H03K 19/00384; H03K 19/017545; H03K 19/00361; H03K 19/018521; H03K 19/018571; G11C 29/50008; H04L 25/0278; H04L 25/12; H01L 2924/3011; H03H 11/28; H03H 7/38; H03H 11/405; H03H 17/0045; H03H 7/40; G01R 31/3191; G06F 13/4086
 See application file for complete search history.

(56) References Cited

U.S. PATENT DOCUMENTS

| | | | |
|---|---|---|---|
| 7,372,295 B1* | 5/2008 | Wei | H04L 25/0278 326/27 |
| 7,410,293 B1* | 8/2008 | Santurkar | G01K 7/015 327/512 |
| 7,423,450 B2* | 9/2008 | Santurkar | H03K 19/0005 326/108 |
| 7,679,397 B1* | 3/2010 | Kok | H03K 19/0005 326/30 |
| 8,035,418 B2 | 10/2011 | Oh et al. | |
| 8,963,577 B2 | 2/2015 | Anderson et al. | |
| 9,172,562 B2 | 10/2015 | Chen | |
| 9,484,916 B1* | 11/2016 | Chia | H03K 19/0005 |
| 9,684,321 B2* | 6/2017 | Leibowitz | G05F 1/462 |
| 9,704,591 B2* | 7/2017 | Taigor | G11C 16/28 |

* cited by examiner

US 10,103,731 B2

CALIBRATION CIRCUIT FOR ON-CHIP DRIVE AND ON-DIE TERMINATION

CROSS REFERENCE TO OTHER APPLICATIONS

This application is a continuation of U.S. patent application Ser. No. 15/226,488, entitled CALIBRATION CIRCUIT FOR ON-CHIP DRIVE AND ON-DIE TERMINATION, filed Aug. 2, 2016, now U.S. Pat. No. 9,780,785, issued Oct. 3, 2017, which claims priority to U.S. Provisional Patent Application No. 62/270,344, entitled CALIBRATION CIRCUIT FOR ON-CHIP DRIVE AND ON-DIE TERMINAL, filed Dec. 21, 2015, both of which are incorporated herein by reference for all purposes.

BACKGROUND OF THE INVENTION

Recent input-output (I/O) interface circuits for integrated circuits use differential input buffers in which the input signal is compared to a reference voltage Vref, which is equal to one-half of the positive power supply voltage Vddq applied to the I/O interface circuits.

In some applications, such as DRAM integrated circuits, on-die termination (ODT) is used to improve input signal fidelity by providing an on-chip impedance (referred to as the "termination impedance") between the input signal and the positive power supply voltage Vddq as well as the input signal and the reference power supply voltage Vss (usually the ground voltage). Furthermore, in some applications, such as DRAM integrated circuits, off-chip driver impedance adjustment (OCD) is provided to enable the output drive strength of the integrated circuit to be set to a target value using an off-chip resistor as a reference impedance. The on-die termination impedance and the output drive strength (or output drive impedance) are provided as on-chip impedance where the on-chip impedance is typically set using an impedance matching scheme to match the on-chip impedance to an off-chip resistor at a given reference voltage Vref. The reference voltage is typically equal to one-half of the power supply voltage Vddq.

In some implementations, an on-chip calibration circuit is used to calibrate an on-chip reference impedance which is then used to set the on-chip impedance for ODT or OCD. Conventional calibration circuits typically implement an impedance matching scheme to set the on-chip reference impedance to match the impedance of the off-chip resistor. A reference voltage Vref of one-half of the positive power supply voltage Vddq is supplied to the integrated circuit and the calibration circuit calibrates the on-chip reference impedance to match the impedance of the off-chip resistor at the reference voltage Vref. Once calibrated, the on-chip reference impedance of the calibration circuit is then used to set the termination impedance for on-die termination or the output driver impedance for output drive strength.

FIG. 1 illustrates a calibration scheme using impedance matching for setting an on-chip impedance of an integrated circuit to match an off-chip resistor in some examples. Referring to FIG. 1, the conventional calibration scheme involves connecting a current source or a pull-up circuit 2 between a positive power supply voltage Vddq and an off-chip resistor RZQ. In the present description, power supply voltages Vddq and Vssq refer to the positive power supply voltage and the reference power supply voltage, respectively, used for the input-output (I/O) circuits of the integrated circuit. The reference power supply voltage Vssq can be the ground voltage. On the other hand, the positive power supply voltage Vdd refers to the positive power supply voltage used for the internal circuits of the integrated circuit. The positive power supply voltage Vddq and the positive power supply voltage Vdd may have the same voltage value or may have different voltage values.

The current of the current source or the strength of the pull-up circuit 2 is adjusted by changing logic states to increase the number of active pullup elements or by changing bias voltages to the pull-up circuit until the voltage at a common node ZQ between the pull-up circuit 2 and the off-chip resistor RZQ is equal to the reference voltage Vref provided to the integrated circuit. The reference voltage is typically one-half of the power supply voltage Vddq, i.e. Vref=½Vddq. In that case, the impedance of the pull-up circuit 2 would be equal to the impedance of the off-chip resistor RZQ. This is true because the voltages across the off-chip resistor RZQ and the pull-up circuit 2 are equal (i.e. ½*Vddq) and the current through the elements are also equal since they are connected in series. Based on Ohm's Law (resistance R=V/I), the resistances (or impedances) of the pull-up circuit 2 and the off-chip resistor RZQ would therefore be equal.

To set the impedance of the pull-down circuit, the final logic states or bias conditions for the pull-up circuit 2 are applied to a mirror pull-up circuit 3 that is connected in series with a pull-down circuit 4. The mirror pull-up circuit 3, with its impedance set equal to resistor RZQ based on the applied bias conditions, can then be used to calibrate the pull-down circuit 4 using the same impedance matching principle. That is, the impedance of the pull-own circuit 4 is adjusted until the voltage at the common node 5 equals to the reference voltage Vref being one-half of the supply voltage Vddq. Then, the impedance of the pull-down circuit 4 matches the impedance of the mirror pull-up circuit 3 and both are set to equal to the impedance of the off-chip resistor RZQ. With the pull-up and pull-down circuits thus calibrated, their logic states or bias conditions are stored and can then be used to set the actual on-chip impedance used for ODT or OCD to target values.

More specifically, the on-chip impedance is typically implemented using a pull-up circuit, a pull-down circuit, or a pull-up circuit connected in series with a pull-down circuit. The pull-up circuit is typically implemented as one or more PMOS transistors connected in parallel between the positive power supply voltage Vddq and an input/output (I/O) node. In some cases, one or more resistors are placed between the PMOS transistors and the I/O node. The pull-down circuit is typically implemented as one or more NMOS transistors connected in parallel between an output node and the reference power supply voltage Vssq (or ground). In some cases, one or more resistors are placed between the NMOS transistors and the I/O node. As used herein, a "pull-up circuit 1X" refers to a pull-up circuit including one or more parallel connected PMOS transistors that has its impedance set to equal to the impedance of the off-chip resistor RZQ. A pull-up circuit 1X is sometimes referred to as a pull-up circuit unit. Similarly, as used herein, a "pull-down circuit 1X" refers to a pull-down circuit including one or more parallel connected NMOS transistors that has its impedance set to equal to the impedance of the off-chip resistor RZQ. A pull-down circuit 1X is sometimes referred to as a pull-down circuit unit.

In some examples, the calibration circuit calibrates a pull-up circuit unit and a pull-down circuit unit to match the impedance of the off-chip resistor. For instance, during the calibration process, one or more transistors within the pull-up circuit unit are turned on to set the impedance of the pull-up circuit unit to match the impedance of the off-chip resistor RZQ. In one example, a digital code is applied to the bank of PMOS transistors in the pull-up circuit unit to selectively turn on one or more of the PMOS transistors in the pull-up circuit unit to obtain the desired impedance value RZQ. Similarly, during the calibration process, one or more transistors within the pull-down circuit unit are turned on to set the impedance of the pull-down circuit unit to match the impedance of the off-chip resistor RZQ. In one example, a digital code is applied to the bank of NMOS transistors in the pull-down circuit unit to selectively turn on one or more of the NMOS transistors in the pull-down circuit unit to obtain the desired impedance value RZQ. The digital code resulting from the calibration process for the pull-up circuit unit may not be the same as the digital code for the pull-down circuit.

The pull-up circuit unit and the pull-down circuit unit in the calibration circuit are dummy circuits, that is, they are not the actual pull-up/pull-down circuits used to provide the termination impedance used for ODT or the driver impedance for OCD. Instead, the logic states or bias conditions for the dummy pull-up circuit and the dummy pull-down circuit in the calibration circuit are stored and the logic states or bias conditions are applied to the actual pull-up circuit and the actual pull-down circuit to generate the desired on-chip impedance values for on-die termination or output drive strength adjustment. For example, the logic states or bias conditions may be the digital codes used to selectively turn on one or more of the transistors in the pull-up circuit and the pull-down circuit.

FIG. 2 illustrates the results of the conventional calibration scheme. As a result of the impedance matching calibration method, a pull-up circuit unit 6 (Pull Up 1X) is calibrated to have an impedance equal to the impedance of resistor RZQ when the pull-up circuit unit 6 is biased to the reference voltage Vref of ½ Vddq. Furthermore, as a result of the impedance matching calibration method, a pull-down circuit unit 8 (Pull Down 1X) is calibrated to have an impedance equal to the impedance of resistor RZQ when the pull-down circuit unit 8 is biased to the reference voltage Vref of ½*Vddq. The bias conditions for the pull-up circuit unit and pull-down circuit unit obtained from the calibration circuit are applied to the actual pull-up and pull-down circuits to set the impedance of the actual pull-up and pull-down circuits to target values related to the impedance of the off-chip resistor.

In some examples, to set the target impedance value for the on-chip termination or the output driver impedance, the stored digital code for the pull-up circuit is applied to the bank of pull-up transistors to selectively turn on one or more of the pull-up transistors to obtain the target impedance value. Moreover, the stored digital code for the pull-down circuit is applied to the bank of pull-down transistors to selectively turn on one or more of the pull-down transistors to obtain the target impedance value.

FIG. 3 is a circuit diagram of a conventional calibration circuit for setting an on-chip impedance of an integrated circuit to match an off-chip resistor in some examples. Referring to FIG. 3, a calibration circuit 20 implements a current mirror method to calibrate the pull-up impedance and the pull-down impedance to match the impedance of the off-chip resistor at the reference voltage. In the calibration circuit 20 of FIG. 3, PMOS transistor MP1 and PMOS transistor MP2 form a current mirror. The off-chip resistor RZQ is connected in series with transistor MP1 between a power supply voltage Vdd or Vddq and ground. The common node ZQ between the transistor MP1 and resistor RZQ is coupled to a comparator 21 which also receives a reference voltage Vref equal to ½*Vddq. The comparator 21 adjusts the gate bias voltage of the transistor MP1 until the voltage at node ZQ equals the reference voltage Vref. At that point, the impedance of PMOS transistor MP1 is set equal to the resistance of resistor RZQ. Note that in some cases, the power supply voltage Vdd for internal circuitry is used to supply the current mirror transistors MP1 and MP2. In other cases, the power supply voltage Vddq for the I/O circuits is used. The comparator 21 sets the voltage at node ZQ to a value of ½*Vddq which is equal to the reference voltage Vref.

The current flowing in PMOS transistor MP1 (I=Vref/RZQ) is mirrored to PMOS transistor MP2 which is connected in series with a pull-down circuit unit 22. The current through transistor MP2 is the same as the current through transistor MP1 because they are the same size and the terminal voltages are the same. A comparator 24 operates to set the logic states or the bias conditions of the pull-down circuit unit 22 so that the voltage at the common node 23 equals the reference voltage Vref of ½*Vddq. At that point, the impedance of pull-down circuit unit 22 is set equal to the impedance of transistor MP2 which is equal to the resistance of resistor RZQ.

The logic states or bias conditions for the pull-down circuit unit 22 are applied to a mirror pull-down circuit unit 26 which is connected in series with a pull-up circuit unit 28. A comparator 29 operates to set the logic states or bias conditions of the pull-up circuit unit 28 so that the voltage at the common node 27 equals the reference voltage Vref of ½*Vddq. At that point, the impedance of the pull-up circuit unit 28 is set equal to the impedance of the pull-down circuit unit 26 which is equal to the resistance of resistor RZQ.

Through the calibration circuit 20, the logic states or bias conditions to set a pull-up circuit unit and a pull-down circuit unit to match the impedance of the off-chip resistor RZQ are obtained. The logic states or bias conditions are stored by the integrated circuit to be applied to the actual pull-up circuit and the actual pull-down circuit used for ODT or OCD to obtain the desired impedance values. While the calibration circuit 20 of FIG. 3 is able to handle a large capacitance value at the ZQ node, the calibration circuit is more susceptible to instability as the current mirrors and comparators can cause oscillation.

FIG. 4 is a circuit diagram of a conventional calibration circuit for setting an on-chip impedance of an integrated circuit to match an off-chip resistor in some examples. Referring to FIG. 4, a calibration circuit 30 is implemented without the use of current mirrors and therefore the calibration circuit is less susceptible to oscillation. However, the capacitance at the ZQ node receiving the off-chip resistor cannot be too large. In the calibration circuit 30 of FIG. 4, a pull-up circuit unit 32 is connected in series with the off-chip resistor RZQ between the power supply voltage Vddq and ground. The common node ZQ between the pull-up circuit unit 32 and resistor RZQ is coupled to a comparator 34 which also receives a reference voltage Vref equal to ½*Vddq. The comparator 34 varies the logic states or bias conditions of the pull-up circuit unit 32 until the voltage at node ZQ equals the reference voltage Vref. At that point, the impedance of pull-up circuit unit 32 is set equal to the resistance of resistor RZQ.

The logic states or bias conditions for the pull-up circuit unit 32 are applied to a mirror pull-up circuit unit 36 which is connected in series with a pull-down circuit unit 39 between the power supply voltage Vddq and ground. A comparator 38 operates to set the logic states or bias conditions of the pull-down circuit unit 39 so that the voltage at the common node 37 equals the reference voltage Vref of $½*Vddq$. At that point, the impedance of pull-down circuit unit 39 is set equal to the resistance of resistor RZQ.

Through the calibration circuit 30, the logic states or bias conditions to set a pull-up circuit unit and a pull-down circuit unit to match the resistance of the off-chip resistor RZQ are obtained. The logic states or bias conditions are stored by the integrated circuit to be applied to the pull-up circuit and the pull-down circuit used for ODT or OCD to obtain the desired impedance values. While the calibration circuit 30 of FIG. 4 achieves greater stability through eliminating the use of current mirrors, the capacitance at the ZQ node has to be no more than a certain value to ensure that calibration can be completed within the desired time.

In conventional integrated circuits, the impedance used for ODT and OCD is specified at a reference voltage Vref of $½*Vddq$. Accordingly, the conventional impedance matching calibration scheme described above works well to set the desired on-chip impedance values. However, the conventional impedance matching calibration scheme does not work in applications where a reference voltage Vref other than $½*Vddq$ is used. For example, in the above-described example, the on-chip termination is realized using equal pull-up and pull-down impedances. Thus, a reference voltage Vref of $½*Vddq$ can be used as the voltage across the equal pull-up and pull-down impedance. However, in some applications, an integrated circuit may employ high-side termination where the on-chip termination impedance is provided only to the positive power supply Vddq. In that case, the integrated circuit uses a reference voltage Vref that is set to a value higher than half of the power supply Vddq. For example, the integrated circuit may receive a reference voltage that is $0.7*Vddq$.

When the reference voltage Vref is not $½*Vddq$, the conventional impedance matching calibration scheme does not work because the voltage across the off-chip resistor and the voltage across the pull-up/pull-down circuit to be matched are necessarily different. Pull-up and pull-down circuits are typically constructed using transistors, which are nonlinear devices. Therefore, the impedance must be set at the specified reference voltage Vref value and the impedance cannot be accurately extrapolated from an impedance value calibrated for a reference voltage $Vref=½*Vddq$. For these reasons, the conventional impedance matching calibration scheme cannot be effectively used to set the on-chip impedance in applications where the reference voltage Vref is not equal to $½*Vddq$. A large error may result where the on-chip impedance does not match well with the desired off-chip resistor.

BRIEF DESCRIPTION OF THE DRAWINGS

Various embodiments of the invention are disclosed in the following detailed description and the accompanying drawings.

DETAILED DESCRIPTION

Figure 1:
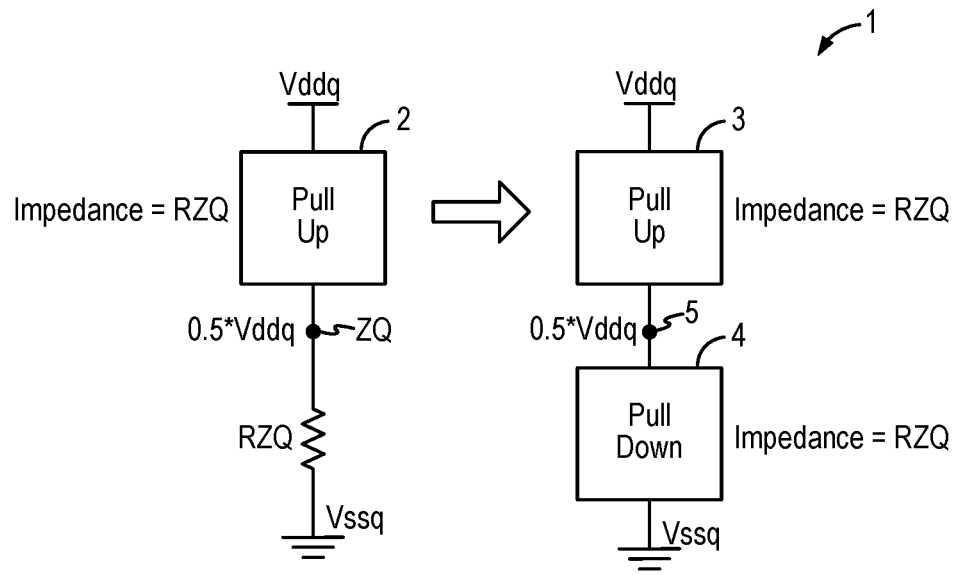
FIG. 1 illustrates a calibration scheme using impedance matching for setting an on-chip impedance of an integrated circuit to match an off-chip resistor in some examples.
Figure 2:
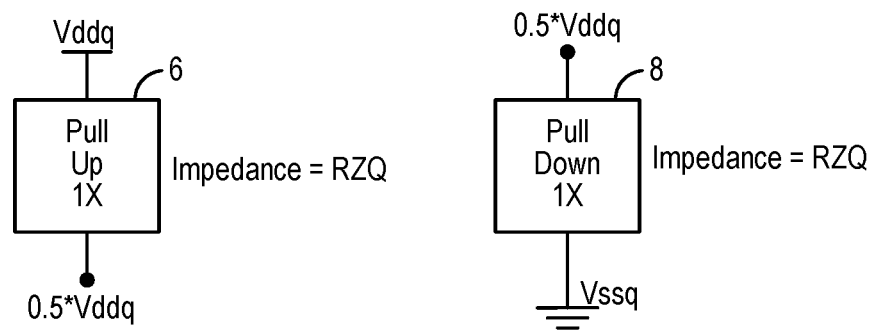
FIG. 2 illustrates the results of the conventional calibration scheme.
Figure 3:
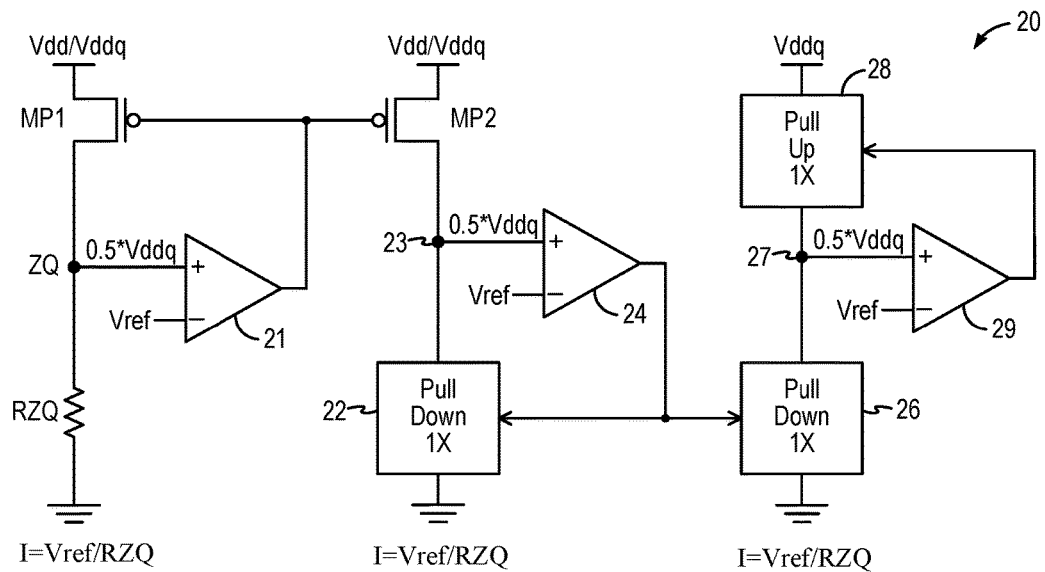
FIG. 3 is a circuit diagram of a conventional calibration circuit for setting an on-chip impedance of an integrated circuit to match an off-chip resistor in some examples.
Figure 4:
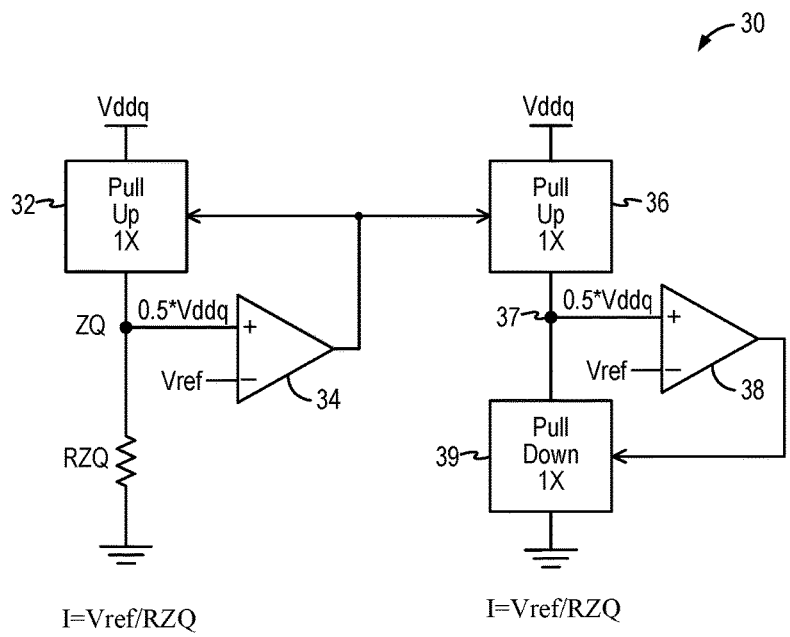
FIG. 4 is a circuit diagram of a conventional calibration circuit for setting an on-chip impedance of an integrated circuit to match an off-chip resistor in some examples.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, calibration circuits and methods to set an on-chip impedance of an integrated circuit to match a target impedance where the reference voltage does not equal one-half of the positive power supply voltage Vddq for the I/O interface circuit are described. In some examples, the target impedance is an off-chip impedance of the integrated circuit. In particular, calibration circuits and methods are provided to enable accurate impedance matching at a reference voltage Vref of $K*Vddq$, where K is a number between 0 and 1 and Vddq is the power supply voltage used for the input-output (I/O) circuits of the integrated circuit.

In embodiments of the present invention, a calibration circuit for impedance matching at a reference voltage Vref of $K*Vddq$ uses a ratioed current mirror. That is, the size of the current mirror is adjusted to enable impedance matching at a reference voltage other than one-half Vddq. In another embodiment, a calibration circuit for impedance matching at a reference voltage Vref of $K*Vddq$ uses a ratioed mirror pull-up circuit. That is, the size of the mirror pull-up circuit is adjusted to enable impedance matching at a reference voltage other than one-half Vddq. In yet another embodiment, a calibration circuit for impedance matching at a reference voltage Vref of K*Vddq uses a ratioed target impedance. That is, the target impedance is adjusted to enable impedance matching at a reference voltage other than one-half Vddq.

In some examples, the on-chip impedance being calibrated is used to set the on-chip impedance used in on-die termination (ODT) or off-chip driver impedance adjustment (OCD). More specifically, the calibrated on-chip impedance may be used to set the impedance values for on-chip impedance being used as termination impedance for input terminals. Alternately, the calibrated on-chip impedance may be used to set the impedance values for on-chip impedance being used as the output drive impedance of output terminals as programmed by the target impedance, which is usually an off-chip resistor.

In the present description, the positive power supply voltage Vddq and the reference power supply voltage Vssq refer to the power supply voltages used for the input and output (I/O) circuits of the integrated circuit. The reference power supply voltage Vssq can be the ground voltage. The positive power supply voltage Vdd and the reference power supply voltage Vss refer to the power supply voltages used for the internal circuits of the integrated circuit. The reference power supply voltage Vss can be the ground voltage. The positive power supply voltage Vddq and the positive power supply voltage Vdd may have the same voltage value or may have different voltage values. Typically, the power supply voltages Vdd and Vss have less noise than the power supply voltages Vddq and Vssq.

In some examples, when the Vddq and Vdd voltages have the same voltage value, the output driver circuits of the integrated circuit are supplied by the Vddq and Vssq power supply voltages while the input buffers and the on-die termination impedance are supplied by the Vdd and Vss power supply voltages. In another example, when the Vddq and Vdd voltages have the different voltage values, the output driver circuits of the integrated circuit are supplied by the Vddq and Vssq power supply voltages. The input buffers are supplied by the Vdd and Vss power supply voltages while the on-die termination impedance are supplied by the Vddq and the Vss power supply voltages.

Conventional calibration schemes implementing impedance matching provide accurate impedance calibration only when the reference voltage is equal to one-half of the positive power supply voltage Vddq. When the reference voltage is not one-half of the power supply voltage Vddq, conventional calibration schemes can result in large errors in the calibrated impedance value. According to embodiments of the present invention, the calibration circuit and method of the present invention provides for accurate calibration, even for cases where the reference voltage is not equal to ½*Vddq.

For instance, when the on-chip termination is realized by using equal pull-up and pull-down impedance, for example, 60 ohms pull-up and 60 ohms pull-down, the impedance is centered around ½*Vddq and the calibration of the on-chip impedance can be performed by using a reference voltage Vref of ½*Vddq. However, in some applications, an integrated circuit may employ high-side termination where the on-chip termination is provided only to the positive power supply Vddq only, that is, 60 ohms pull-up without any pull-down. In that case, the reference voltage Vref is set to a value higher than half of the power supply Vddq. For example, the reference voltage may be 0.7*Vddq. The calibration circuit must therefore be able to match the on-chip impedance to the off-chip impedance at a reference voltage that is not ½*Vddq. For example, the calibration circuit must be able to match the on-chip impedance to the off-chip impedance at Vref=K*Vddq, e.g., at Vref=0.7*Vddq. In those cases, the conventional calibration circuit will result in a large error in the impedance matching. That is, the resulting on-chip impedance will not match the off-chip impedance. The calibration circuits and methods of the present invention enable accurate impedance matching at a reference voltage Vref of K*Vddq, where K does not have to equal 0.5.

Figure 10:
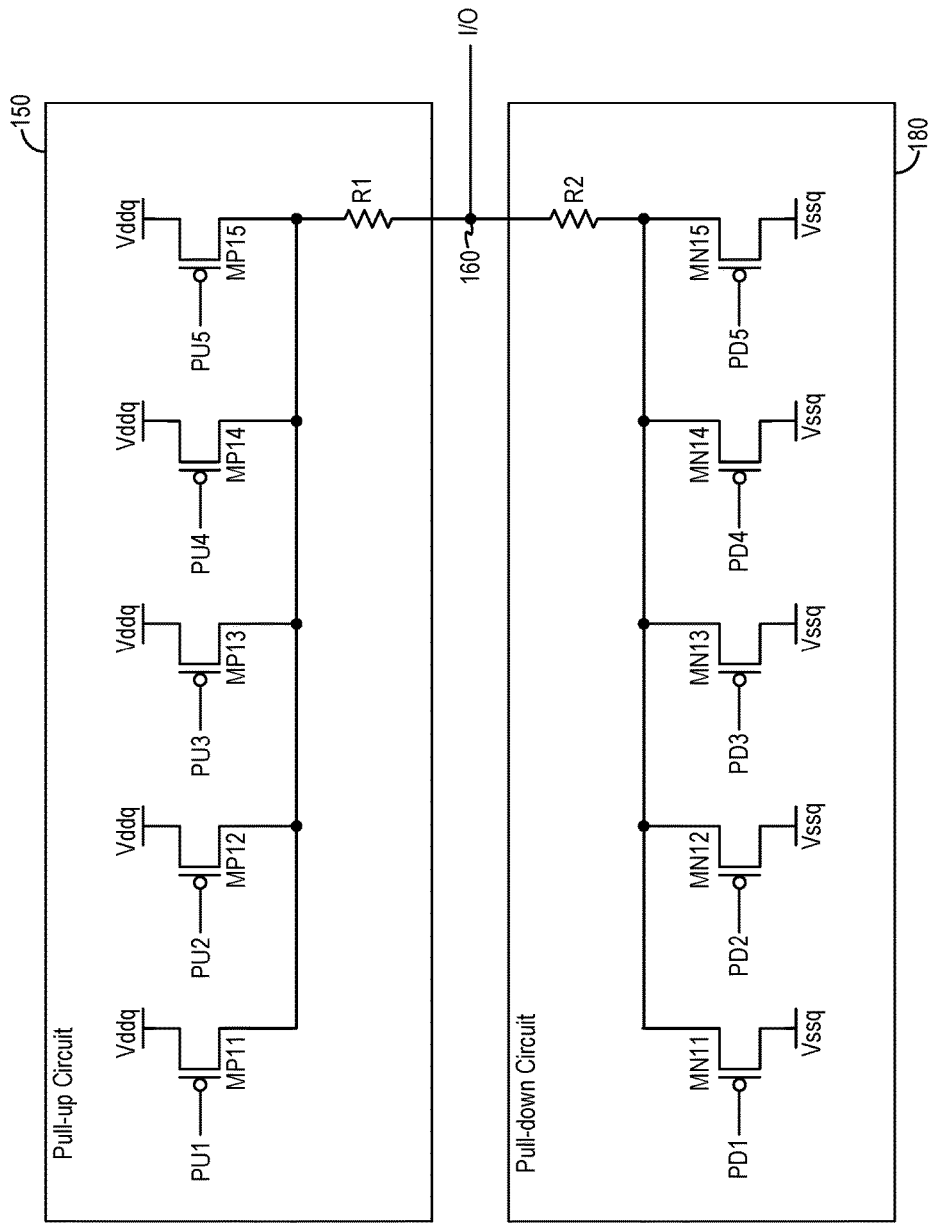
FIG. 10 is a circuit diagram illustrating an on-chip impedance circuit implemented using a pull-up circuit and a pull-down circuit in some embodiments.

In the present description, the on-chip impedance is typically implemented using a pull-up circuit, a pull-down circuit, or a pull-up circuit connected in series with a pull-down circuit. FIG. 10 is a circuit diagram illustrating an on-chip impedance circuit implemented using a pull-up circuit and a pull-down circuit connected in series in some embodiments. Referring to FIG. 10, a pull-up circuit 150 is implemented as one or more PMOS transistors connected in parallel and then connected in series with a resistor R1 between the positive power supply voltage Vddq and an input/output node 160. In the present example, the pull-up circuit 150 includes five PMOS transistors MP11 to MP15 and resistor R1, each transistor being controlled by respective control signals PU1 to PU5. A pull-down circuit 180 is implemented as one or more NMOS transistors connected in parallel and then connected in series with a resistor R2 between the input/output node 160 and the reference power supply voltage Vssq (or ground). In the present example, the pull-down circuit 180 includes five NMOS transistors MN11 to MN15 and resistor R2, each transistor being controlled by respective control signals PD1 to PD5. The calibration circuit generates the logic states or digital codes or bias conditions which are applied to the control signals PU1 to PU5 and PD1 to PD5 to control whether one or more of the PMOS transistors MP11 to MP15 and one or more of the NMOS transistors MN11 to MN15 are to be turned on to obtain the desired on-chip impedance.

In the embodiment shown in FIG. 10, the pull-up resistor R1 is connected in series between the bank of PMOS transistors MP11 to MP15 and the input/output node 160. Also, the pull-down resistor R2 is connected in series between the bank of NMOS transistors MN11 to MN15 and the input/output node 160. The pull-up resistor R1 and the pull-down resistor R2 are optional and may be omitted in other embodiments of the on-chip impedance circuit.

As used herein, a "pull-up circuit 1X" refers to a pull-up circuit including one or more parallel connected PMOS transistors that has its impedance set equal to the impedance of the off-chip resistor RZQ. The pull-up circuit may also include a series resistor. A pull-up circuit 1X is sometimes referred to as a pull-up circuit unit. Similarly, as used herein, a "pull-down circuit 1X" refers to a pull-down circuit including one or more parallel connected NMOS transistors that has its impedance set equal to the impedance of the off-chip resistor RZQ. The pull-down circuit may also include a series resistor. A pull-down circuit 1X is sometimes referred to as a pull-down circuit unit.

In embodiments of the present invention, the calibration circuit calibrates a pull-up circuit unit and a pull-down circuit unit to match the impedance of the off-chip resistor. For instance, during the calibration process, one or more PMOS transistors within the pull-up circuit unit are turned on to set the impedance of the pull-up circuit unit to match the impedance of the off-chip resistor RZQ. In one example, a digital code is applied to the bank of PMOS transistors in the pull-up circuit unit to selectively turn on one or more of the PMOS transistors in the pull-up circuit unit to obtain the desired impedance value RZQ. Similarly, during the calibration process, one or more NMOS transistors within the pull-down circuit unit are turned on to set the impedance of the pull-down circuit unit to match the impedance of the off-chip resistor RZQ. In one example, a digital code is applied to the bank of NMOS transistors in the pull-down circuit unit to selectively turn on one or more of the NMOS transistors in the pull-down circuit unit to obtain the desired impedance value RZQ. The digital code or logic states obtained for the pull-up circuit unit may not be the same as the digital code obtained for the pull-down circuit.

The pull-up circuit unit and the pull-down circuit unit in the calibration circuit are dummy circuits, that is, they are not the actual pull-up/pull-down circuits used to provide the termination impedance used for ODT or the driver impedance for OCD. Instead, the logic states or bias conditions for the dummy pull-up circuit and the dummy pull-down circuit in the calibration circuit are stored and the logic states or bias conditions are applied to the actual pull-up circuit and the actual pull-down circuit to generate the desired on-chip impedance values for on-die termination or output drive strength adjustment.

Figure 5:
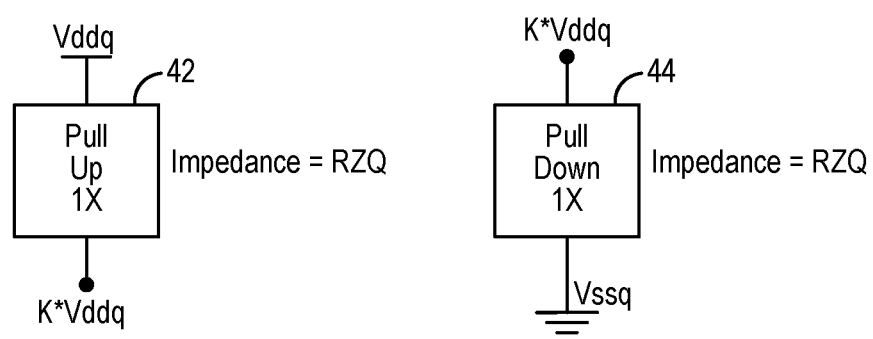
FIG. 5 illustrates the desired result of the calibration circuits and methods in embodiments of the present invention.

FIG. 5 illustrates the desired result of the calibration circuits and methods in embodiments of the present invention. As a result of the calibration performed using the calibration circuits and methods of the present invention, a pull-up circuit unit 42 (Pull Up 1X) is calibrated to have an impedance equal to the impedance of an off-chip resistor RZQ when the pull-up circuit unit 42 is biased to the reference voltage Vref of K*Vddq, where K is a number between 0 and 1. Furthermore, as a result of the calibration performed using the calibration circuits and methods of the present invention, a pull-down circuit unit 44 (Pull Down 1X) is calibrated to have an impedance equal to the impedance of an off-chip resistor RZQ when the pull-down circuit unit 44 is biased to the reference voltage Vref of K*Vddq, where K is a number between 0 and 1.

In embodiments of the present invention, the calibration circuits and methods can perform the on-chip impedance calibration on-the-fly or off-line. For instance, the calibration circuits and methods of the present invention can be configured to perform the calibration on-the-fly. That is, the calibration circuit of the present invention can be operated in the background during normal integrated circuit operation. An on-chip timer may be used to initiate the calibration operation periodically. At a predetermined time, the calibration sequence is performed to calibrate the impedances of the on-chip pull-up and pull-down circuits to match the impedance of the off-chip resistor. Then, the logic states or bias conditions obtained are stored on the integrated circuit to be applied to the actual on-chip impedance used for circuit operations.

On the other hand, the calibration circuits and methods of the present invention can be configured to perform the calibration off-line, such as when the integrated circuit is put in a test mode or a set-up mode. During off-line calibration, normal circuit operation is stopped. The calibration sequence is performed to calibrate the impedance of the on-chip pull-up and pull-down circuits to match the impedance of the off-chip resistor. Then, the logic states or bias conditions obtained are stored on the integrated circuit to be applied to the actual on-chip impedance used for circuit operations. The normal circuit operation can then be started.

Figure 6:
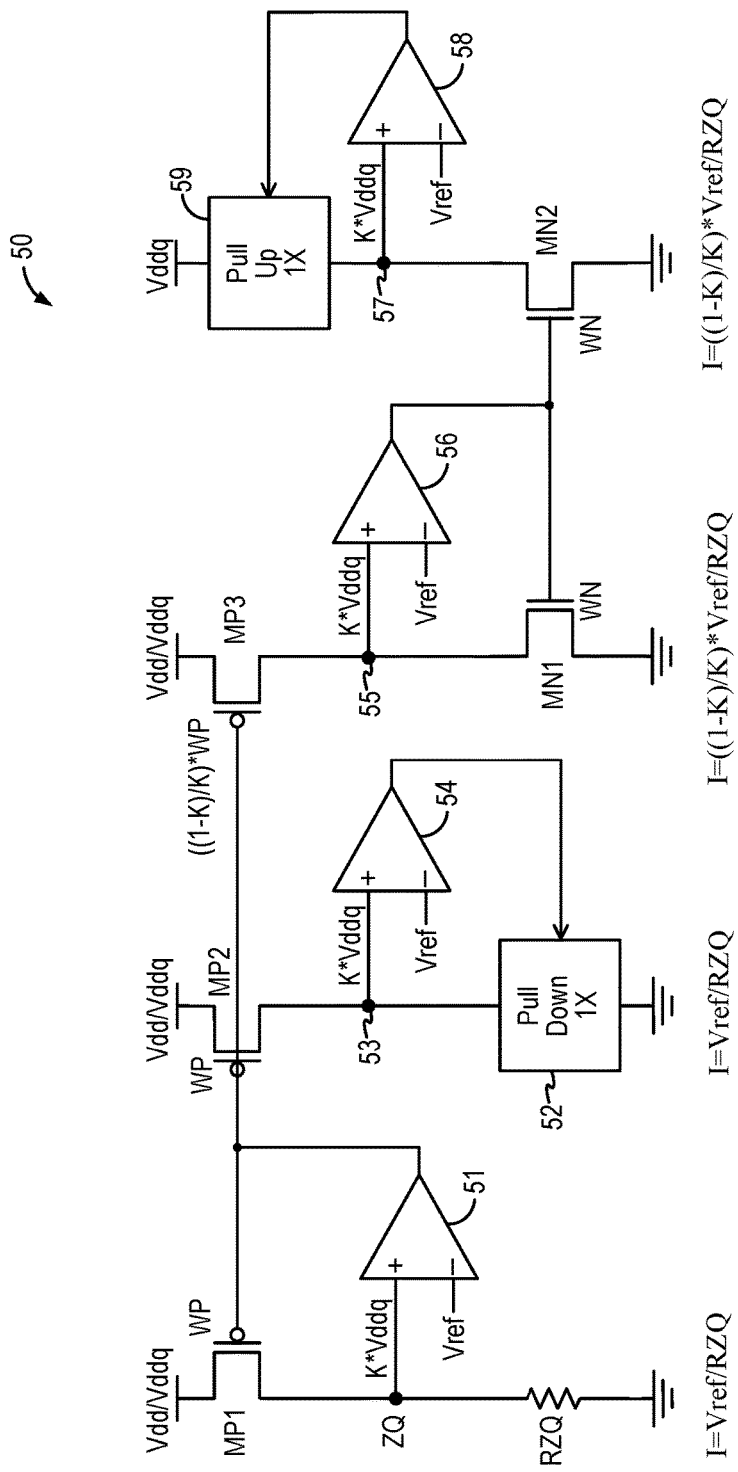
FIG. 6 is a circuit diagram of a calibration circuit for setting an on-chip impedance of an integrated circuit to match a resistance of an off-chip resistor according to embodiments of the present invention.

FIG. 6 is a circuit diagram of a calibration circuit for setting an on-chip impedance of an integrated circuit to match a resistance of an off-chip resistor according to embodiments of the present invention. Referring to FIG. 6, a calibration circuit 50 implements a current mirror method to calibrate an on-chip pull-up impedance and an on-chip pull-down impedance to match the impedance of an off-chip resistor RZQ at the reference voltage where the reference voltage Vref is K times the positive power supply voltage for the I/O circuit (Vref=K*Vddq), K being a number between 0 and 1 and Vddq being the positive power supply voltage for the I/O circuit. For example, K can be 0.7 and the reference voltage Vref is equal to 0.7*Vddq.

In the calibration circuit 50, PMOS transistor MP1 and PMOS transistor MP2 form a current mirror and are constructed using PMOS transistors of the same size. That is, the PMOS transistors MP1 and MP2 have the same transistor width WP. PMOS transistor MP1 is connected in series with the off-chip resistor RZQ between the power supply voltage Vdd and ground. PMOS transistor MP1 acts as a pull-up current source transistor. The gate bias applied to the PMOS transistor MP1 is adjusted by a comparator 51 to modulate the drain current supplied by the PMOS transistor MP1 so that the voltage on a common node ZQ between the pull-up current source and resistor RZQ is equal to the reference voltage Vref supplied to the calibration circuit. When the node ZQ is biased to the reference voltage Vref, the voltage at node ZQ is equal to Vref=K*Vddq and the current flowing through the pull-up current source (MP1) and the resistor RZQ is given as:

$$I_{MP1} = \frac{Vref}{RZQ} = \frac{K*Vddq}{RZQ}.$$

The current flowing through transistor MP1 is mirrored to PMOS transistor MP2 acting as a pull-up current mirror transistor. Current mirror transistor MP2 is connected in series with a mirror pull-down circuit 52 between the power supply voltage Vdd and ground. The logic states or bias conditions of the pull-down circuit 52 are adjusted by a comparator 54 to vary the impedance of the pull-down circuit 52 so that the voltage on a common node 53 between the current mirror transistor MP2 and the pull-down circuit 52 is equal to the reference voltage Vref. When the node 53 is biased to the reference voltage Vref, the voltage at node 53 is Vref=K*Vddq and the current flowing through the current mirror transistor MP2 and the mirror pull-down circuit 52 is given as:

$$I_{MP2} = \frac{Vref}{RZQ} = \frac{K*Vddq}{RZQ}.$$

At that point, the impedance of the mirror pull-down circuit 52 is set equal to the impedance or resistance of resistor RZQ.

Calibration circuit 50 includes a second pull-up current mirror transistor MP3 forming a current mirror with pull-up current source transistor MP1 but having a size ratio of (1−K)/K relative to the pull-up current source transistor MP1. That is, the PMOS transistor MP1 has the transistor width WP and the PMOS transistor MP3 has the transistor width of ((1−K)/K)*WP. Accordingly, pull-up current mirror transistor MP3 mirrors (1−K)/K times the current flowing through transistor MP1. Current mirror transistor MP3 is connected in series with an NMOS transistor MN1 between the power supply voltage Vdd and ground. NMOS transistor NM1 acts a pull-down current source transistor. The gate bias applied to the NMOS transistor MN1 is adjusted by a comparator 56 to adjust the drain current supplied by the NMOS transistor MN1 so that the voltage on a common node 55 between the current mirror transistor MP3 and the pull-down current source transistor MN1 is equal to the reference voltage Vref supplied to the calibration circuit. When the node 55 is biased to the reference voltage Vref, the voltage at node 55 is equal to Vref=K*Vddq and the impedance of the NMOS transistor MN1 is set to be the same as the impedance of the PMOS transistor MP3. The current flowing through the pull-down current source (transistor MN1) is (1−K)/K times the current flowing through resistor RZQ and is given as:

$$I_{MN1} = \frac{(1-K)}{K} \times \frac{Vref}{RZQ} = \frac{(1-K)}{K} \times \frac{K*Vddq}{RZQ} = \frac{(1-K)*Vddq}{RZQ}.$$

NMOS transistor MN1 and NMOS transistor MN2 form a current mirror and are constructed using NMOS transistors of the same size. That is, the NMOS transistors MN1 and MN2 have the same transistor width WN. Pull-down current mirror transistor MN2 is connected in series with a pull-up circuit 59 between the power supply voltage Vddq and ground. The logic states or bias condition of the pull-up circuit 59 is adjusted by a comparator 58 to vary the impedance of the pull-up circuit 59 so that the voltage on a common node 57 between the current mirror transistor MN2 and the mirror pull-up circuit 59 is equal to the reference voltage Vref. When the node 57 is biased to the reference voltage Vref, the voltage at node 57 is Vref=K*Vddq while the voltage across the pull-up circuit 59 is (1−K)*Vddq. The current flowing through the current mirror transistor MN2 and the pull-up circuit 59 is given as:

$$I_{MN2} = \frac{(1-K)}{K} \times \frac{Vref}{RZQ} = \frac{(1-K)}{K} \times \frac{K*Vddq}{RZQ} = \frac{(1-K)*Vddq}{RZQ}.$$

That is, the current flowing through the pull-up circuit 59 is (1−K)/K times the current flow through the resistor RZQ. Therefore, the impedance RPU of the pull-up circuit 59 is set equal to the impedance or resistance of resistor RZQ:

$$RPU = \frac{V}{I} = \frac{(1-K)*Vddq}{((1-K)*Vddq)/RZQ} = RZQ.$$

With the calibration circuit thus operated, the pull-down circuit 52 and the pull-up circuit 59 are set to an impedance equal to the impedance of resistor RZQ. The logic states or bias conditions of the control signals to set the pull-up circuit 59 and the pull-down circuit 52 are stored. In particular, the logic states or bias conditions are stored by the integrated circuit to be applied to the actual pull-up circuit and the actual pull-down circuit used for ODT or OCD to obtain the desired impedance values.

The calibration circuit 50 using full size pull-up circuit and full size pull-down circuit realizes advantages in better impedance matching accuracy. However, the use of current mirrors may make the calibration circuit more susceptible to instability.

In the above described embodiment, the comparators can be an analog comparator or a digital comparator. An analog comparator generates an output voltage while a digital comparator generates a digital code output. For example, in FIG. 6, comparators 51 and 56 are analog comparators to generate an output voltage to drive the current source transistors. On the other hand, comparators 54 and 58 can be analog or digital comparators. When implemented as digital comparators, comparators 54 and 58 generate digital code output to control how many transistors in the pull-up or pull-down circuit are to be turned on. When implemented as analog comparators, comparators 54 and 58 generate an output voltage which controls the amount of current through the pull-up and pull-down transistors.

In the above described embodiment, the PMOS current mirror transistors MP1, MP2 and MP3 are coupled to the power supply voltage Vdd for internal circuitry. The power supply voltage Vdd is usually preferred because the power supply voltage has less noise than Vddq. In other embodiments, the PMOS current mirror transistors MP1, MP2 and MP3 may be coupled to the power supply voltage Vddq for the I/O circuitry. The use of a specific power supply voltage for the PMOS current mirror transistors is not critical to the practice of the present invention.

Figure 7:
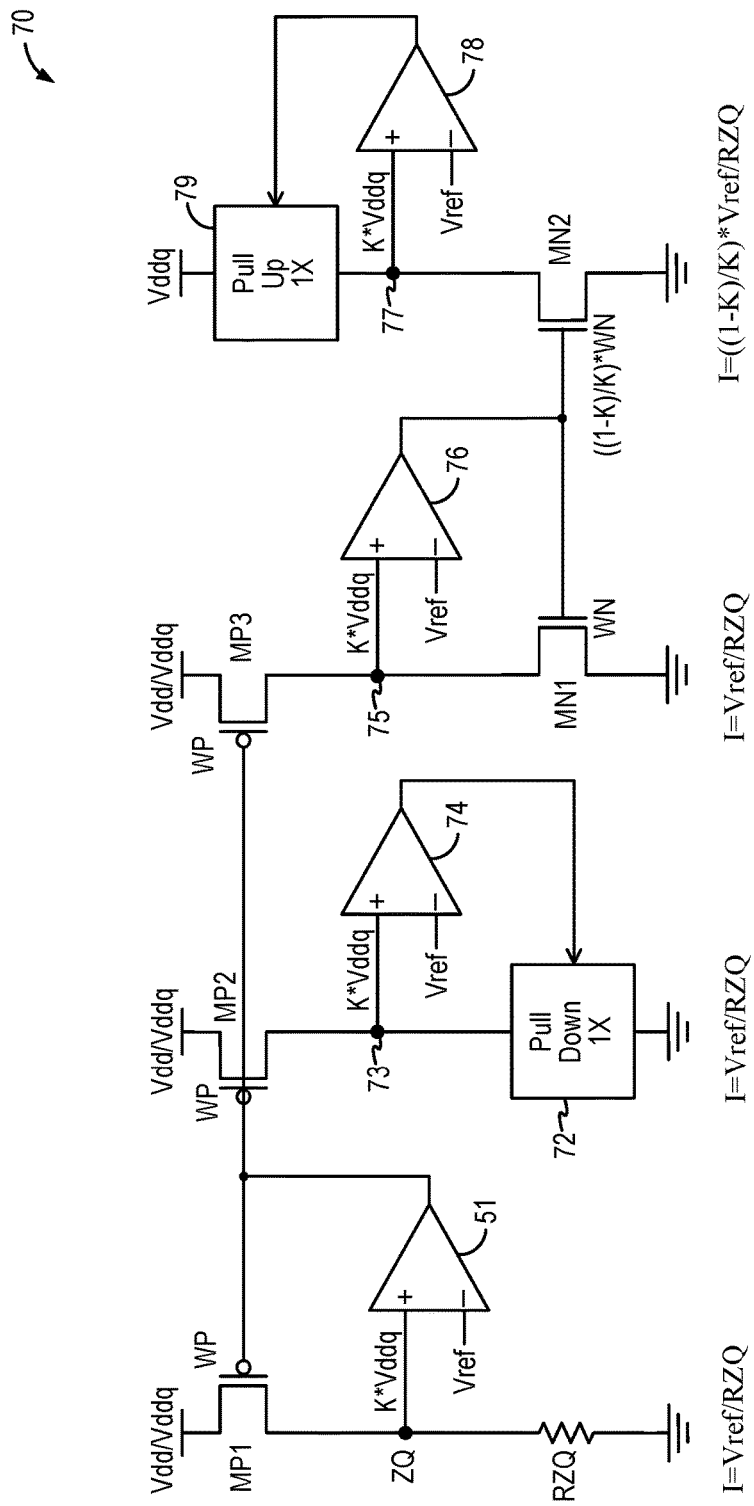
FIG. 7 is a circuit diagram of a calibration circuit for setting an on-chip impedance of an integrated circuit to match a resistance of an off-chip resistor according to an alternate embodiment of the present invention.

FIG. 7 is a circuit diagram of a calibration circuit for setting an on-chip impedance of an integrated circuit to match a resistance of an off-chip resistor according to an alternate embodiment of the present invention. Referring to FIG. 7, a calibration circuit 70 is constructed in the same manner as the calibration circuit 50 of FIG. 6 except that the pull-down current mirror transistor MN2 is ratioed instead of the pull-up current mirror transistor MP3.

In calibration circuit 50 of FIG. 6, the pull-up current mirror transistor MP3 has a size ratio of (1−K)/K relative to the pull-up current source transistor MP1 while the pull-down current mirror transistor MN2 has the same size as the pull-down current source transistor MN1.

In the calibration circuit 70 of FIG. 7, the pull-up current mirror transistor MP3 has the same size as the pull-up current source transistor MP1 while the pull-down current mirror transistor MN2 has a size ratio of (1−K)/K relative to the pull-down current source transistor MN1. That is, the NMOS transistor MN1 has the transistor width WN and the NMOS transistor MN2 has the transistor width of (1−K)/K*WN. Accordingly, pull-down current mirror transistor MN2 mirrors (1−K)/K times the current flowing through transistor MN1.

The operation of the calibration circuit 70 is the same as the calibration circuit 50 of FIG. 6 except that the ratioed current is generated only at the last branch of the calibration circuit. That is the current flowing through the pull-up current mirror transistor MP3 and the pull-down current source transistor MN1 is the same as the current flowing through the resistor RZQ. The current flowing through the pull-down current mirror transistor MN2 is ratioed relative to the current flowing through the resistor RZQ and is given as:

$$I_{MN2} = \frac{(1-K)}{K} \times \frac{Vref}{RZQ} = \frac{(1-K)}{K} \times \frac{K*Vddq}{RZQ} = \frac{(1-K)*Vddq}{RZQ}.$$

When the node 77 is biased to the reference voltage Vref, the voltage at node 77 is equal to Vref=K*Vddq and the voltage across the pull-up circuit 79 is (1−K)*Vddq and the impedance RPU of the pull-up circuit 79 is set equal to the impedance or resistance of resistor RZQ:

$$RPU = \frac{V}{I} = \frac{(1-K)*Vddq}{((1-K)*Vddq)/RZQ} = RZQ.$$

Figure 8:
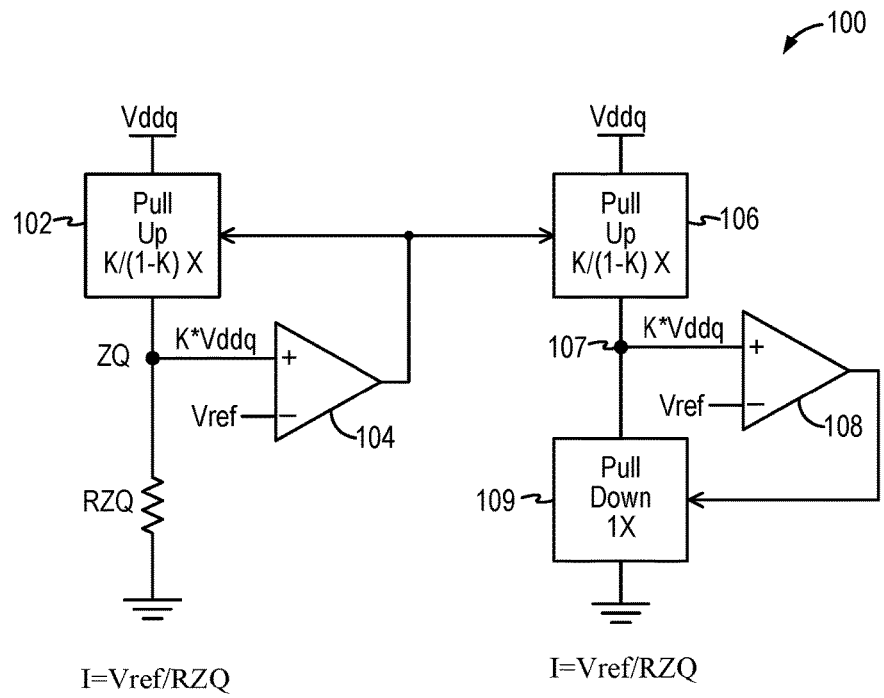
FIG. 8 is a circuit diagram of a calibration circuit for setting an on-chip impedance of an integrated circuit to match a resistance of an off-chip resistor according to alternate embodiments of the present invention.

FIG. 8 is a circuit diagram of a calibration circuit for setting an on-chip impedance of an integrated circuit to match a resistance of an off-chip resistor according to alternate embodiments of the present invention. Referring to FIG. 8, a calibration circuit 100 is implemented without the use of current mirrors and therefore the calibration circuit is less susceptible to instability. In the calibration circuit 100 of FIG. 8, a pull-up circuit 102 is connected in series with the off-chip resistor RZQ between the I/O power supply voltage Vddq and ground. In embodiments of the present invention, the pull-up circuit 102 is a ratioed pull-up circuit. That is, the ratioed pull-up circuit 102 is sized to provide K/(1−K) times the current of a pull-up circuit unit (or pull-up circuit 1X). To achieve this, the width of the transistors in the pull-up circuit 102 would be sized to be K/(1−K) of the widths of the transistors in a pull-up circuit unit. Also, the resistors in the pull-up circuit 102 would have resistances (1−K)/K times the resistance of the resistors in a pull-up circuit unit. The ratioed pull-up circuit 102 has an impedance that is (1−K)/K times the impedance of the pull-up circuit unit (or pull-up circuit 1X).

More specifically, the pull-up circuit unit (1X) is formed as a bank of parallel connected PMOS transistors where each PMOS transistor has a transistor width of WP. The ratioed pull-up circuit 102 is formed as a bank of parallel connected PMOS transistors where each PMOS transistor has a transistor width that is K/(1−K) times WP. As a result, the resistance of the PMOS transistors in the ratioed pull-up circuit is (1−K)/K times the resistance of the PMOS transistors in the pull-up circuit unit (1X).

The common node ZQ between the ratioed pull-up circuit 102 and resistor RZQ is coupled to a comparator 104 which also receives a reference voltage Vref equal to K*Vddq. The comparator 104 varies the logic states or bias conditions of the ratioed pull-up circuit 102 until the voltage at node ZQ equals to the reference voltage Vref. The voltage across the ratioed pull-up circuit 102 is (1−K)Vddq which is (1−K)/K times the voltage across resistor RZQ. At that point, the impedance of ratioed pull-up circuit 102 is set equal to (1−K)/K times the resistance of resistor RZQ. That is, the impedance RPU of the ratioed pull-up circuit 102 is given as:

$$RPU = \frac{V}{I} = \frac{(1-K)*Vddq}{(K*Vddq)/RZQ} = \frac{(1-K)}{K}RZQ.$$

The logic states or bias conditions for the ratioed pull-up circuit 102 are stored and are used to set the impedance of the actual pull-up circuit, such as to set the impedance of a pull-up circuit unit (1X), to the resistance of resistor RZQ. Because the impedance of the pull-up circuit unit is K/(1−K) times the impedance of the ratioed pull-up circuit 102, when the logic states or bias conditions for the ratioed pull-up circuit 102 are applied to a pull-up circuit unit (1X), the impedance $R_{1X}$ of a pull-up circuit unit will be set to the resistance of resistor RZQ as follows:

$$R_{1X} = \frac{K}{(1-K)} \times RPU = \frac{K}{(1-K)} \times \frac{(1-K)}{K}RZQ = RZQ.$$

The logic states or bias conditions for the ratioed pull-up circuit 102 are applied to drive a mirror pull-up circuit 106 which is connected in series with a pull-down circuit unit (1X) 109 between the power supply voltage Vddq and ground. The mirror pull-up circuit 106 is a ratioed pull-up circuit in the same manner as ratioed pull-up circuit 102. That is, ratioed pull-up circuit 106 is sized to be K/(1−K) times the strength of the pull-up circuit unit (or pull-up circuit 1X). Meanwhile, the pull-down circuit 109 is a unit sized pull-down circuit 1X. A comparator 108 operates to set the logic states or bias conditions of the pull-down circuit unit 109 so that the voltage at the common node 107 equals the reference voltage Vref of K*Vddq. At that point, the impedance RPD of the pull-down circuit unit 109 is set equal to the resistance of resistor RZQ:

$$RPD = \frac{V}{I} = \frac{K*Vddq}{(K*Vddq)/RZQ} = RZQ.$$

The calibration circuit 100 of FIG. 8 realizes improved stability as compared to the calibration circuits of FIGS. 6 and 7 using current mirrors. However, the pull-up circuit used in the calibration circuit is ratioed and therefore the pull-up circuit is sized differently as compared to the actual pull-up circuit unit. However, the size of the pull-up circuit is selected so that when the logic states and the bias condition of the ratioed pull-up circuit is applied to a pull-up circuit unit (1X), the desired impedance value of resistance RZQ is obtained.

Figure 9:
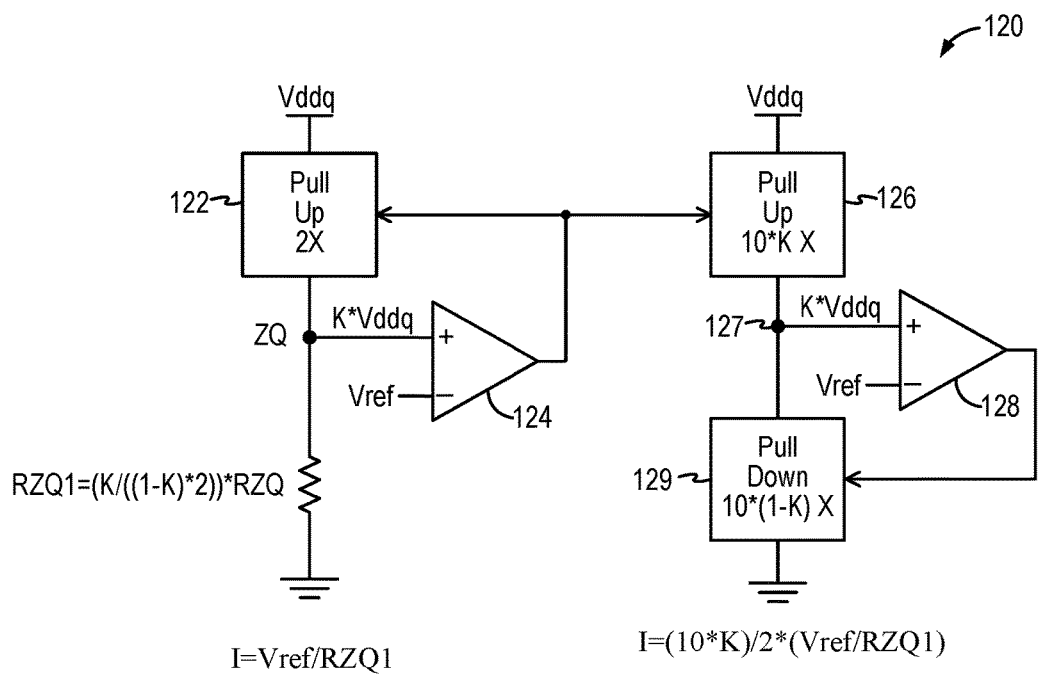
FIG. 9 is a circuit diagram of a calibration circuit for setting an on-chip impedance of an integrated circuit to match a resistance of an off-chip resistor according to alternate embodiments of the present invention.

FIG. 9 is a circuit diagram of a calibration circuit for setting an on-chip impedance of an integrated circuit to match a resistance of an off-chip resistor according to alternate embodiments of the present invention. Referring to FIG. 9, a calibration circuit 120 is constructed in the same manner as the calibration circuit 100 of FIG. 8 except with the use of a ratioed off-chip resistance and the use of multiples of the pull-up circuit unit and the pull-down circuit unit as the pull-up and pull-down circuits.

In the calibration circuit 120 of FIG. 9, a pull-up circuit 122 is connected in series with the off-chip resistor RZQ1 between the I/O power supply voltage Vddq and ground. In embodiments of the present invention, the off-chip resistor RZQ1 has a resistance value that is a ratio of the target resistance value of RZQ. More specifically, the resistance of the off-chip resistor RZQ1 is given as:

$$R_{RZQ1} = \frac{K}{2*(1-K)}RZQ,$$

where RZQ denotes the target resistance desired for the pull-up circuit unit (1X) and the pull-down circuit unit (1X).

Furthermore, in embodiments of the present invention, the pull-up circuit 122 is a 2X multiple of a pull-up circuit unit. That is, the pull-up circuit 122 is constructed using two pull-up circuit units (1X) connected in parallel. The common node ZQ between the mirror pull-up circuit 122 and resistor RZQ1 is coupled to a comparator 124 which also receives a reference voltage Vref equal to K*Vddq. The comparator 124 varies the logic states or bias conditions of the pull-up circuit 122 until the voltage at node ZQ equals to the reference voltage Vref. The voltage across the pull-up circuit 122 (2X) is (1−K)*Vddq. At that point, the impedance of pull-up circuit 122 (2X) is set equal to RZQ/2 as follows:

$$R_{2X} = \frac{(1-K)Vddq}{Vref/RZQ1} = (1-K)Vddq \times \frac{RZQ1}{K*Vddq} =$$
$$\frac{(1-K)}{K}RZQ1 = \frac{(1-K)}{K} \times \frac{K}{2*(1-K)}RZQ = \frac{RZQ}{2}.$$

The logic states or bias conditions for the pull-up circuit 122 are stored and are used to set the impedance of the actual pull-up circuit, such as to set the impedance of a pull-up circuit unit (1X) to the resistance of resistor RZQ. Because the impedance of the pull-up circuit unit is 2 times the impedance of the pull-up circuit (2X) 122, when the logic states or bias conditions for the pull-up circuit (2X) 122 are applied to a pull-up circuit unit (1X), the impedance of the pull-up circuit unit will be set to the target resistance RZQ.

The logic states or bias conditions for the pull-up circuit 122 are applied to drive a pull-up circuit 126 which is connected in series with a pull-down circuit 129 between the power supply voltage Vddq and ground. The pull-up circuit 126 is a 10*K multiple of a pull-up circuit unit. Meanwhile, the pull-down circuit 129 is a 10*(1−K) multiple of a pull-down circuit unit. A comparator 128 operates to set the logic states or bias conditions of the pull-down circuit 129 so that the voltage at the common node 127 equals the reference voltage Vref of K*Vddq.

The current flowing through the off-chip resistor RZQ1 is given as:

$$I_{RZQ1} = \frac{Vref}{RZQ1} = \frac{K*Vddq}{RZQ1}.$$

Meanwhile, the current flowing through the pull-down circuit 129 is given as:

$$I_{PD} = \frac{10*K}{2} \times \frac{Vref}{RZQ1} =$$
$$\frac{10*K}{2} \times \frac{K*Vddq}{K*RZQ/((1-K)*2)} = \frac{10*K*(1-K)*Vddq}{RZQ}.$$

When the common node 127 is set equal to the reference voltage Vref of K*Vddq, the impedance RPD of the pull-down circuit 129 is set equal to RZQ/(10(1−K)) as follows:

$$RPD = \frac{K*Vddq}{I_{PD}} = K*Vddq \times \frac{2RZQ1}{10K(K*Vddq)} =$$
$$\frac{RZQ1}{5K} = \frac{K}{2*(1-K)}RZQ \times \frac{1}{5K} = \frac{RZQ}{10(1-K)}.$$

The logic states or bias conditions for the pull-down circuit 129 is stored and is used to set the impedance of the actual pull-down circuit, such as to set the impedance of a pull-down circuit unit (1X) to the resistance of resistor RZQ. Because the impedance of the pull-down circuit unit is 10(1−K) times the impedance of the pull-down circuit 129, when the logic states or bias conditions for the pull-down circuit 129 are applied to a pull-down circuit unit (1X), the impedance of the pull-down circuit unit will be set to the target resistance RZQ.

The calibration circuit 120 of FIG. 9 is useful in cases where a custom off-chip resistance value can be used. In some applications, the off-chip resistance value has to be the same as the target resistance value RZQ as specified by universal data sheets in the industry. In those cases, the calibration circuit 120 of FIG. 9 cannot be used. However, in other applications, when the off-chip resistance value can be customized and set as a ratio of the target resistance value RZQ, then the calibration circuit 120 can be advantageously applied. A salient feature of the calibration circuit 120 is that multiples of the pull-up/pull-down circuit unit are used, instead of using ratioed pull-up/pull-down circuits. Using multiples of the pull-up/pull-down circuit unit enables the calibration circuit 120 to realize more accurate impedance matching than when ratioed pull-up/pull-down circuits are used.

In the calibration circuit 120, the pull-up circuits and pull-down circuits are selected to be 2 times multiple, or 10*K times multiple, or 10*(1−K) times multiple of a pull-up/pull-down circuit unit. In other embodiments, other size ratio can be used as appropriate to generate the desired impedance values which can then be translated to the pull-up and pull-down circuit units.

Furthermore, in the above-described embodiments, the calibration circuit is described as being used to calibrate on-chip impedances of an integrated circuit to match an off-chip impedance or an off-chip resistor. In other embodiments, the calibration circuit can be used to calibrate on-chip impedances of an integrated circuit to match any target impedance, where the target impedance can be an off-chip resistor, or an on-chip resistor or an on-chip impedance of the integrated circuit. The exact structure of the target impedance to be matched is not critical to the practice of the present invention.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A calibration circuit for setting an on-chip impedance of an integrated circuit to match a target impedance comprising:

a first pull-up circuit connected in series with the target impedance between a positive power supply voltage and a reference power supply voltage, the first pull-up circuit being a ratioed pull-up circuit sized to be K/(1−K) times a size of a pull-up circuit unit, K being a number between 0 and 1, other than 0.5, and the positive power supply voltage being a positive power supply voltage for input-output circuits of the integrated circuit;

a first comparator configured to compare a voltage at a first common node between the first pull-up circuit and the target impedance to a reference voltage and to generate an output signal to drive the first pull-up circuit so that the voltage at the first common node equals the reference voltage, the reference voltage being K times the positive power supply voltage other than one-half the positive power supply voltage, wherein the first pull-up circuit has an impedance being set equal to (1−K)/K times the target impedance;

a second pull-up circuit connected in series with a pull-down circuit between the positive power supply voltage and the reference power supply voltage, the second pull-up circuit having the same size as the first pull-up circuit and being driven by the same output signal applied to the first pull-up circuit, and the pull-down circuit having a size equal to a pull-down circuit unit; and a second comparator configured to compare a voltage at a second common node between the second pull-up circuit and the pull-down circuit to the reference voltage and to generate an output signal or logic states to drive the pull-down circuit so that the voltage at the second common node equals the reference voltage, wherein the pull-down circuit has an impedance being set equal to the target impedance.

2. The calibration circuit of claim 1, wherein the first and second pull-up circuits each comprises one or more PMOS transistors connected in parallel and the pull-down circuit comprises one or more NMOS transistors connected in parallel.

3. The calibration circuit of claim 2, wherein each of the first and second pull-up circuits further comprises a first resistor connected in series with the one or more parallel connected PMOS transistors; and the pull-down circuit further comprises a second resistor connected in series with the one or more parallel connected NMOS transistors.

4. The calibration circuit of claim 2, wherein the first pull-up circuit comprises one or more parallel connected PMOS transistors, each transistor having a first transistor width, and a pull-up circuit unit comprises the same number of parallel connected PMOS transistors as the first pull-up circuit, each transistor having a second transistor width, the first transistor width being $K/(1-K)$ times the second transistor width, and wherein in response to the first pull-up circuit being biased to the impedance equal to $(1-K)/K$ times the target impedance, a bias condition of the first pull-up circuit is applied to a pull-up circuit unit to bias the pull-up circuit unit to an impedance equal to the target impedance.

5. The calibration circuit of claim 2, wherein the first comparator generates the output signal to drive the first pull-up circuit so that the voltage at the first common node equals the reference voltage by turning on one or more of the parallel connected PMOS transistors in the first pull-up circuit.

6. The calibration circuit of claim 2, wherein the second comparator generates the output signal to bias the pull-down circuit so that the voltage at the second common node equals the reference voltage by turning on one or more of the parallel connected NMOS transistors in the pull-down circuit.

7. The calibration circuit of claim 1, wherein the output signals generated by the first and second comparators comprise logic states or bias conditions.

8. The calibration circuit of claim 1, wherein the target impedance comprises a resistance of an off-chip resistor of the integrated circuit.

9. A calibration circuit for setting an on-chip impedance of an integrated circuit to match a target impedance comprising:

a first pull-up circuit connected in series with a ratioed target impedance between a positive power supply voltage and a reference power supply voltage, the first pull-up circuit being formed as N multiple of pull-up circuit units connected in parallel, the ratioed target impedance having an impedance that is a ratio of the target impedance;

a first comparator configured to compare a voltage at a first common node between the first pull-up circuit and the ratioed target impedance to a reference voltage and to generate an output signal to drive the first pull-up circuit so that the voltage at the first common node equals the reference voltage, the reference voltage being K times the positive power supply voltage, K being a number between 0 and 1 and the positive power supply voltage being a positive power supply voltage for input-output circuits of the integrated circuit, wherein the first pull-up circuit has an impedance being set equal to $1/N$ times the target impedance;

a second pull-up circuit connected in series with a pull-down circuit between the positive power supply voltage and the reference power supply voltage, the second pull-up circuit being formed as $M*K$ multiple of pull-up circuit units connected in parallel, the second pull-up circuit being driven by the same bias condition or logic states applied to the first pull-up circuit, and the pull-down circuit being formed as $M*(1-K)$ multiple of pull-down circuit units connected in parallel; and a second comparator configured to compare a voltage at a second common node between the second pull-up circuit and the pull-down circuit to the reference voltage and to generate an output signal to drive the pull-down circuit so that the voltage at the second common node equals the reference voltage, wherein the pull-down circuit has an impedance being set equal to $1/(M*(1-K))$ times the target impedance.

10. The calibration circuit of claim 9, wherein the first and second pull-up circuits each comprises one or more PMOS transistors connected in parallel and the pull-down circuit comprises one or more NMOS transistors connected in parallel.

11. The calibration circuit of claim 10, wherein each of the first and second pull-up circuits further comprises a first resistor connected in series with the one or more parallel connected PMOS transistors; and the pull-down circuit further comprises a second resistor connected in series with the one or more parallel connected NMOS transistors.

12. The calibration circuit of claim 9, wherein in response to the first pull-up circuit being biased to the impedance equal to $1/N$ times the target impedance, a pull-up circuit unit is set to an impedance equal to the target impedance.

13. The calibration circuit of claim 9, wherein in response to the pull-down circuit being biased to the impedance equal to $1/M*(1-K)$ times the target impedance, a pull-down circuit unit is set to an impedance equal to the target impedance.

14. The calibration circuit of claim 10, wherein the first comparator generates the output signal to drive the first pull-up circuit so that the voltage at the first common node equals the reference voltage by turning on one or more of the parallel connected PMOS transistors in the first pull-up circuit.

15. The calibration circuit of claim 10, wherein the second comparator generates the output signal to bias the pull-down circuit so that the voltage at the second common node equals the reference voltage by turning on one or more of the parallel connected NMOS transistors in the pull-down circuit.

16. The calibration circuit of claim 9, wherein N is 2 and M is 10.

17. The calibration circuit of claim 9, wherein the output signals generated by the first and second comparators comprise logic states or bias conditions.

18. The calibration circuit of claim 9, wherein the ratioed target impedance comprises a resistance of an off-chip resistor of the integrated circuit, the resistance of the off-chip resistor being selected to be (K/((1−K)*2) of the target impedance.

* * * * *